(12) United States Patent
Demir et al.

(10) Patent No.: US 9,293,654 B2
(45) Date of Patent: Mar. 22, 2016

(54) LIGHT-EMITTING DEVICE

(71) Applicant: NANYANG TECHNOLOGICAL UNIVERSITY, Singapore (SG)

(72) Inventors: Hilmi Volkan Demir, Singapore (SG); Xiaowe Sun, Singapore (SG)

(73) Assignee: NANYANG TECHNOLOGICAL UNIVERSITY, Singapore (SG)

( * ) Notice: Subject to any disclaimer, the term of this patent is extended or adjusted under 35 U.S.C. 154(b) by 0 days.

(21) Appl. No.: 14/355,210

(22) PCT Filed: Oct. 30, 2012

(86) PCT No.: PCT/SG2012/000407
§ 371 (c)(1),
(2) Date: Apr. 30, 2014

(87) PCT Pub. No.: WO2013/066266
PCT Pub. Date: May 10, 2013

(65) Prior Publication Data
US 2014/0306179 A1    Oct. 16, 2014

Related U.S. Application Data

(60) Provisional application No. 61/553,678, filed on Oct. 31, 2011.

(51) Int. Cl.
*H01L 33/28* (2010.01)
*H01L 33/06* (2010.01)
(Continued)

(52) U.S. Cl.
CPC .................. *H01L 33/28* (2013.01); *B82Y 20/00* (2013.01); *H01L 33/06* (2013.01);
(Continued)

(58) Field of Classification Search
USPC ............................................... 257/13
See application file for complete search history.

(56) References Cited

U.S. PATENT DOCUMENTS 5,537,000 A    7/1996  Alivisatos et al.
8,541,503 B2 *  9/2013  Wang et al. ............... 525/98
(Continued)

FOREIGN PATENT DOCUMENTS

WO         03021694 A2    3/2003
WO     WO03021694 A2    3/2003
(Continued)

OTHER PUBLICATIONS

Guzelturk, B., "Semiconductor Quatum Dots Driven by Radiative and Nonradiative Energy Transfer for High-Efficiency Hybrid LEDs and Photovoltaics", A Thesis Submitted to the Department of Electrical and Electronics Engineering and the Graduate School of Engineering and Science of Bilkent University, Aug. 2011, pp. 1-184.*

(Continued)

*Primary Examiner* — Jarrett Stark
*Assistant Examiner* — Charles N Ausar-El

(57) ABSTRACT

A light-emitting device comprising: a hole injection layer, an electron injection layer, and a composite emitter layer including a soft material exciton donor and exciton acceptor nanoparticles substantially dispersed within the exciton donor matrix, wherein electrons from the electron injection layer and holes from the hole injection layer generate excitons in the exciton donor matrix, and the primary mechanism of photon generation at the nanoparticles is substantially through non-radiative energy transfer of the generated excitons directly into the nanoparticles.

15 Claims, 9 Drawing Sheets

(51) Int. Cl.
*B82Y 20/00* (2011.01)
*H01L 51/50* (2006.01)
*H01L 51/00* (2006.01)

(52) U.S. Cl.
CPC ....... *H01L 51/0039* (2013.01); *H01L 51/0092* (2013.01); *H01L 51/502* (2013.01); *H01L 51/5088* (2013.01); *H01L 51/5092* (2013.01)

(56) References Cited

U.S. PATENT DOCUMENTS

| | | |
|---|---|---|
| 2005/0236556 A1 | 10/2005 | Sargent et al. |
| 2010/0237323 A1 | 9/2010 | Akai et al. |
| 2011/0041895 A1* | 2/2011 | Carroll .......................... 136/250 |
| 2011/0227036 A1* | 9/2011 | Vaufrey .......................... 257/13 |
| 2012/0195340 A1* | 8/2012 | Cheon et al. ................. 372/50.1 |
| 2012/0274231 A1* | 11/2012 | Tu et al. ........................ 315/291 |

FOREIGN PATENT DOCUMENTS

| | | |
|---|---|---|
| WO | WO03084292 A1 | 10/2003 |
| WO | WO2005055330 A1 | 6/2005 |

OTHER PUBLICATIONS

Foreign Communication from a Related Counterpart Application, International Search Report and Written Opinion dated Feb. 4, 2013, International Application No. PCT/SG2012/000407 filed on Oct. 30, 2012.
Foreign Communication from a Related Counterpart Application, International Preliminary Report on Patentability dated Dec. 11, 2013 International Application No. PCT/SG2012/000407 filed on Oct. 30, 2012.
Chin, P.T.K. et al., "Energy transfer in hybrid quantum dot light-emitting diodes", Journal of Applied Physics 2008, vol. 104.
Dijken, Addy Van, et al., "Carbazole Compounds as Host Materials for Triplet Emitters in Organic Light-Emitting Diodes: Polymer Hosts for High-Efficiency Light-Emitting Diodes," J. Am. Chem Soc. 2004, vol. 126, p. 7718-7727.
Anikeeva, Polina O. et al., "Quantum Dot Light-Emitting Devices with electroluminescence Tunable over the Entire Visible Spectrum", Nano Lett. 2009, vol. 9, No. 7, p. 2532-2536.
Wang, M., "Polymers as multidentate ligands for surface modification and hierarchical organization of colloidal quantum dots", Thesis, University of Toronto, 2009.
Denisyuk, I. et al., "A Review of High Nanoparticles Concentration Composites; Semiconductor and High Refractive Index Materials, Nanocrystals", Yoshitake Masuda (Ed.), 2010.
Kumar, Brijesh, et al., "Comparing direct charge injection and Forster energy transfer into quantum dots in hybrid organic/inorganic quantum dot light emitting devices", Journal of Applied Physics, 112, 034501, 2012.
Achermann, M., et al., "Energy-transfer pumping of semiconductor nanocrystals using an epitaxial quantum well", Nature 429, 642-464, 2004.
Achermann, M., et al., "Nanocrystal-Based Light-Emitting Diodes Utilizing High-Efficiency Nonradiative Energy Transfer for Color Conversion", Nano Lett. 6, 1396-1400, 2006.
Nizamoglu, Sedat, et al., "Efficient nonradiative energy transfer from InGaN/GaN nanopillars to CdSe/ZnS core/shell nanocrystals", Applied Physics Letters 98, 163108, 2011.
Sun, Q., et al., "Bright, multicoloured light-emitting diodes based on quantum dots", Nature Photonics, vol. 1, 717-722, Dec. 2007.
Kim, Tae-Ho, et al., "Full-colour quantum dot displays fabricated by transfer printing", Nature Photonics, vol. 5, 176-182, Mar. 2011.
Colvin, V. L., et al., "Light-emitting diodes made from cadmium selenide nanocrystals and a semiconducting polymer", Letters to Nature, vol. 370, Aug. 4, 1994.
Coe, Seth, et al., "Electroluminescence from single monolayers of nanocrystals in molecular organic devices", Letters to Nature, vol. 420, Dec. 2002.
Caruge, J. M., et al., "Colloidal quantum-dot light-emitting diodes with metal-oxide charge transport layers", Nature Photonics, vol. 2, Apr. 2008.
Talapin, Dmitri V., et al., "Prospects of Colloidal Nanocrystals for Electronic and Optoelectronic Applications", Chem. Rev. 110, 2010.
Anikeeva, P.O., et al., "Electronic and excitonic processes in light-emitting devices based on organic materials and colloidal quantum dots", Physical Review B 78, 085434, 2008.
Chen, Lei, et al., "White Electroluminescent Single-Polymer Achieved by Incorporating Three Polyfluorene Blue Arms into a Star-Shaped Orange Core", Journal of Polymer Science, vol. 50, 2854-2862, 2012.
Chien, Chen-Han, et al., "Electrophosphorescent Polyflurorenes Containing Osmium Complexes in the Conjugated Backbone", Adv. Funct. Mater. vol. 18, 1430-1439, 2008.
Beljonne, D., et al., "Interchain vs. intrachain energy transfer in acceptor-capped conjugated polymers", PNAS, vol. 99, 10982-10987, 2002.
Stöferle, T., et al., "Energy transfer in hybrid organic/inorganic nanocomposites", Nano Lett. vol. 9, 453-456, 2009.
Gösele, U., et al., "Diffusion and long-range energy transfer", Chem. Phys. Lett., vol. 34, 519-522, 1975.
Lim, J., et al., "Perspective on synthesis, device structures, and printing processes for quantum dot displays", Optics Materials vol. 2, 594-628, 2012.
Demir, H.V., et al., "Resonant nonradiative energy transfer in CdSe/ZnS core/shell nanocrystal solids enhances hybrid white light emitting diodes", Optics Express vol. 16, 13961, 2008.
Demir, H.V., et al., "Quantum dot integrated LEDs using photonic and excitonic color conversion", NanoToday, vol. 6, 632, 2011.
Demir, H.V., et al., "Fabrication of a Cross-Linkable, Azide Functionalized, Conjugated and Fluorescent Polyfluorent-Based White Light Source", TR 2008-09254, 2008.
Demir, H.V., et al., "Light Emitting Diodes with High Scotopic/Photopic Ratio Hybridized with Color Converting Semiconductor Materials Sold State Lighting", TR 2009-03593, 2009.
Demir, H.V., et al., "Color-Converting Semiconductor Material Hybridized Light Emitting Diodes Enhanced with Forster Resonance Energy Transfer Method", TR 2009-09585, 2009.
Thornton, Dr. David E., Letter Submission regarding thesis of Aug. 15, 2013 entitled, 'Semiconductor Quantum Dots Driven by Radiative and Nonradiative Energy Transfer for High-Efficiency Hyrid LEDs and Photovoltaics', Bilkent University Library, Bilkent University, Jul. 24, 2015.
Foreign Office Action dated Nov. 4, 2015, European Application Serial No. 12845977.3 -1553, filed on Sep. 10, 2014.
P. 0. Anikeeva et al: "Electronic and excitonic processes in light-emitting devices based on organic materials and colloidal quantum dots", Physical Review. B, Condensed Matter and Materials Physics, vol. 78, No. 8, Aug. 1, 2008, XP055224142, US ISSN: 1098-0121, DOI: 10.1103/PhysRevB.78.085434.
Mattoussi H et al: "Composite thin films of CdSe nanocrystals and a surface passivatingjelectron transporting block copolymer: Correlations between film microstructure by transmission electron microscopy and electroluminescence",Journal of Applied Physics, American Institute of Physics, US, vol. 1. 86, No. 3, Oct. 15, 1999, pp. 4398-4399, XP812848811, ISSN: 0021-8979, DOI: 18.186311.371376 figures 5-7 p. 4295, right-hand column, paragraph 2 sections A and B; pp. 4297-4298.
Shik A et al: "Exciton capture by nanocrysta 1 s in a po 1 ymer matrix", Journal of Applied Physics, American Institute of Physics, US, vol. 94, No. 6, Sep. 15, 2003, pp. 4866-4869, XP812868221, ISSN: 0021-8979, DOI: 18.1863/1.1599974 Section IV. Conclusion, last sentence; p. 4069.

* cited by examiner

LIGHT-EMITTING DEVICE

CROSS-REFERENCE TO RELATED APPLICATIONS

This application is a filing under 35 U.S.C. 371 as the National Stage of International Application No. PCT/SG2012/000407, filed Oct. 30, 2012, entitled "A LIGHT-EMITTING DEVICE", which claims the benefit of and priority to U.S. Provisional Patent Application No. 61/533,678, filed Oct. 31, 2011 and entitled "A LIGHT-EMITTING DEVICE", both of which are incorporated herein by reference in their entirety for all purposes.

FIELD OF THE INVENTION

The present invention relates to a light-emitting device, a method of fabricating a light-emitting device and a light-emitting diode.

BACKGROUND OF THE INVENTION

Various new light-emitting device technologies have started emerging. For example, U.S. patent publication 2012/0112165 proposes a quantum well LED which uses nonradiative energy transfer (NRET) to improve device efficiency. However, commercially this kind of NRET based quantum well LED has been largely unsuccessful to date. This may be because of the difficulty to integrate the NRET structures within the quantum well LEDs using current process technology, and the resulting NRET efficiency is poor due to geometrical reasons.[1,2,3]

Nanocrystal quantum dots (NQDs), are a more promising class of disordered semiconductor colloidal materials[4,5], as they may offer size tunable emission spectra, high photoluminescence (PL) quantum yields, narrow emission full-widths-at-half-maxima (FWHMs) and increased environmental stabilities at reduced costs. Prior art NQD-based electroluminescent devices[6,7,8], commonly rely charge injection pumping of the NQDs. However, charge injection and transport across the NQD thin films are weak, due to passivating and stabilizing organic ligands[9,10,11], and unbalanced, due to different potential barriers for electrons and holes leading to Auger recombination.

As an alternative, organic LEDs (OLEDs) can in principle reach large peak external quantum efficiencies (reported up to 6.3%[12] for fluorescence based OLEDs and 18%[13] for phosphorescence based OLEDs) with proper charge injection and blocking layers. However, polymer based OLEDs may suffer from forbidden emission from the triplet state excitons.

Phosphorescent LEDs are another alternative capable of harvesting triplet excitons, but they may be expensive due to the heavy metal ions used for phosphorescence.

SUMMARY OF THE INVENTION

In the prior art the NRET from conjugated polymers to NQDs is commonly considered to be an exciton diffusion assisted process[14]. However the inventors noted that this related to low NQD loading cases (3-4 w %).

The inventors have identified that a high NQD loaded composite thin polymeric film LED may be desirable. The inventors have also identified that aggregation or agglomeration of the NQDs in such films practically limits the NQD loading and identified that agglomeration hinders the resulting excitonic interactions based on NRET in the LED.

The inventors identified that NRET in electrically driven LEDs is highly sensitive to the separation distance between the donor-acceptor species.

In general terms the invention proposes a composite of nanoparticles (nanocrystals, nanorods, nanowires, nanotetrapods, etc.) chemically integrated into a soft matter or soft material matrix. Thus embodiments of the proposed composite may include high loading without agglomeration that enables efficient excitonic drive of the nanoparticles through substantially complete non-radiative energy transfer.

This may have the advantages that
- the nano-composite promotes highly efficient excitonic pathways with energy transfer efficiencies >70%;
- high loading levels can be achieved (>70 w %); and
- phase segregation can be suppressed, which otherwise may have limited prior art film loadings to 3-4 w % in the case of blending);[15]

while also providing the following properties of
- solution based process-ability;
- low weight;
- large area;
- surface emission;
- flexible substrate; and/or
- low cost.

In an embodiment, light-emitting diodes (LEDs) using exciton injection directly from the constituent polymer to the NQDs demonstrate electroluminescence spectra from the NQDs only as a result of the complete exciton transfer when the LED is electrically driven. This may lead to more than a 10-fold enhancement in the external quantum efficiency compared to without excitonic injection.

In an embodiment, a light-emitting diode comprises:
- a polymer that is electrically driven to form excitons and an inorganic emitter (quantum materials—nanocrystals, nanorods, nanowires, nanotetrapods) that is chemically integrated into the polymer such that a highly-disordered or partially disordered hybrid thin film is attained,
- for which an intimate integration and dispersion are attained with a specific hybridization reducing phase separation while avoiding the formation of aggregates so that high particle loading in the host is made possible, and
- as a result, where strong exciton-exciton interaction is obtained so as to extract excitons from the polymer donor and into the inorganic acceptor to convert the zipped excitons into photons.

Excitonic LEDs can be used in similar applications to organic LEDs, including
- smart phones, PDAs
- all other portable displays
- automotive,
- lighting, etc.

In a first specific expression of the invention there is provided a light-emitting device according to claim 1. In a second specific expression of the invention there is provided a method of fabricating a light-emitting device according to claim 12. In a third specific expression of the invention there is provided a light-emitting diode according to claim 16 or 17. Embodiments may be implemented according to any one of claims 2-11 or 13 to 15.

BRIEF DESCRIPTION OF THE DRAWINGS

One or more example embodiments of the invention will now be described, with reference to the following figures, in which.

DETAILED DESCRIPTION OF THE EMBODIMENTS

Figure 1:
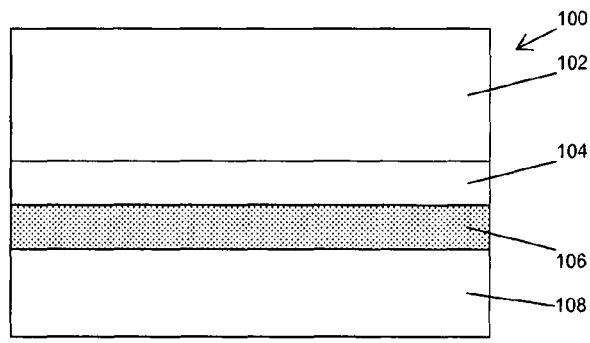
FIG. 1 is a schematic diagram of a light-emitting device according to an example embodiment.

A light-emitting device 100 according to an example embodiment is shown in FIG. 1. The device 100 includes a cathode layer 102, an electron transport layer 104, a composite emitter layer 106 and an anode layer 108. The composite layer 106 may include a soft material matrix with dispersed nanoparticles. As is described later, a hole transport layer may also be provided between the anode layer 108 and the composite layer 106.

The primary photon generation mechanism of the device 100 will now be explained with reference to FIGS. 2a and 2b. The cathode 102 and electron transport layer 104 cooperate to inject electrons into the composite layer 106. The anode 108 (together with the hole transport layer if any) injects holes into the composite layer 106. The combination of the electron and hole injection generates excitons 202 within the soft material matrix 204. As shown particularly in FIG. 2a, the nanoparticles 105 are highly loaded, and are thus closely spaced, but dispersed through the polymer matrix 204. The inventors discovered that with this high, (previously uninvestigated and/or thought impossible) level of loading, the NRET transfer 208 of the excitons 202 to the nanoparticles 206 became substantial, and that inter-chain exciton diffusion of the excitons 202 is suppressed, such that the nanoparticles 206 are the only substantial emitters of photons. The inventors discovery of this NRET transfer exciton injection mechanism 208 in LEDs, may potentially improve the efficiency, compared to electrically excited polymer LEDs using blends of NQDs, by an order of magnitude. For example where the NRET-based exciton transfer is 25% or more, this may be an indication that agglomeration has been minimised and/or inter-chain exciton diffusion has been suppressed.

Figures 2A, 2B:
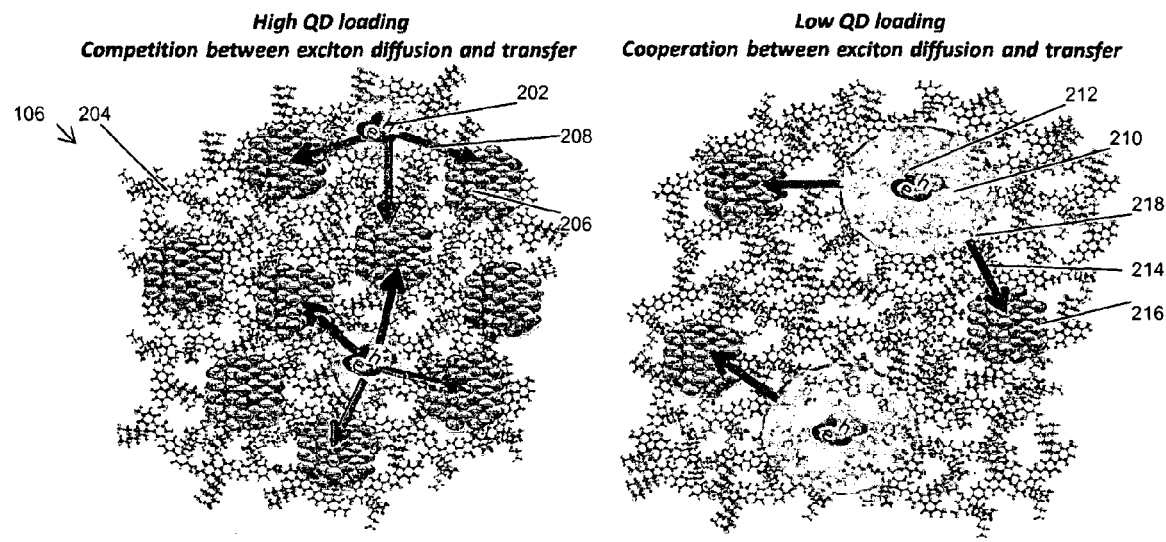
FIG. 2a is a conceptual diagram of the NRET transfer in FIG. 1.
FIG. 2b is a conceptual diagram of the exciton transfer in a prior art device.

FIG. 2b shows a prior art electrically excited polymer LED using blends of NQDs. Due to low loading, an inter-chain exciton diffusion zone 210 systematically expands around each exciton generation site 212. Only after the exciton diffusion, the distance for the exciton transfer becomes small enough. Therefore, in this case, exciton transfer takes place only with the assistance of exciton diffusion. As a result, a weaker transfer 214 of excitons occurs from the periphery 218 of the diffusion zone to the NQDs 216.

The composite layer 106 may more generally comprise a hybrid using 2 or more soft materials or soft matter constituents. Soft materials may include conjugated polymers, small organic molecules, or colloidal particles, amongst others. The composite layer 106 may have at least one constituent that serves as an exciton formation centre and exciton donor 202, and at least one constituent that serves as the exciton acceptor and light emitter 206. Examples include composites of conjugated polymers (P), small organic molecules (M), and colloidal particles (NQD), such as NQD-P, NQD-M, NQD-NQD, NQD-P-M, and NQD-NQD-NQD.

Figure 3:
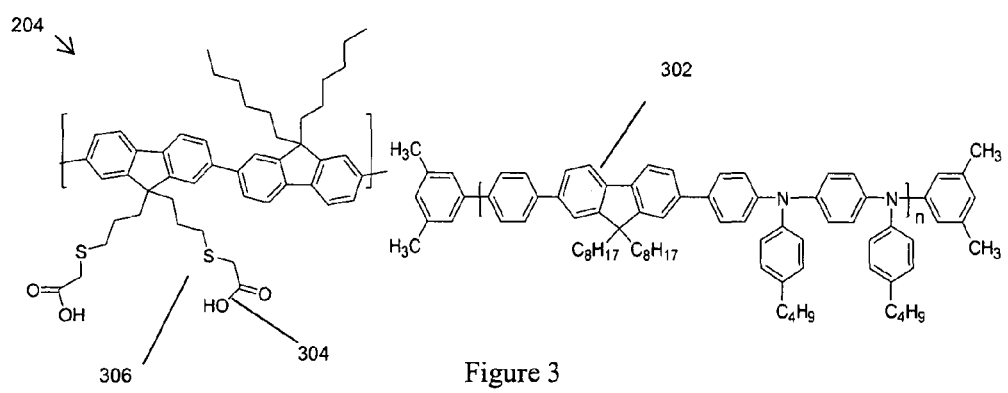
FIG. 3 is a chemical structure of an example polymer for the composite in FIG. 1.

An example of the polymer 204 is shown in FIG. 3. A blue-emitting polyfluorene derivative conjugated polymer 302, is functionalised with sulphide 304 and carboxylic acid moieties 306 containing side chains (carboxymethylsulfonyl-propyl), and acts as the exciton formation medium and the exciton donor. More specifically the polyfluorene derivative conjugated polymer is (poly[(9,9-bis {carboxymethylsulfonyl-propyl}fluorenyl-2,7-diyl)-co(9,9dihexylfluorenyl-2,7-diyl)]), which is referred to below as functionalised PF (since its side-chains are functionalised with carboxymethylsulfonyl groups).

Figure 4:
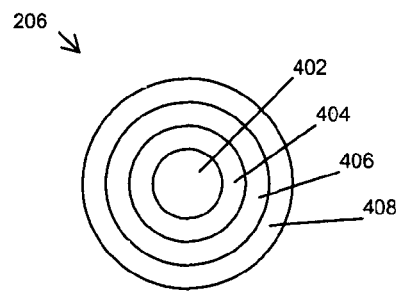
FIG. 4 is a cross-section of an example NQD for the composite in FIG. 1.

An example of the nanoparticle 206 is shown in FIG. 4. The nano particle 206 may comprise a core 402/shell 404/shell 406/surface functionalisation 408 NQD structure. Alternatively other kinds of NQD structure: only core, core/shell, core/shell/shell, etc can be used. The NQD can be made of different materials and their combinations. Other nanoparticles may also be employed depending on the application. According to an example embodiment core/alloyed-shell CdSe 402/CdZnSeS or CdS 404/ZnS 406 NQDs with oleic acid (OA) ligands 408 may be used.

The outer shell 406 and ligands 408 may be chosen as compatible to bind with the linkers 304, 306 as side chain groups to functionalise the polymer and thus to make a composite with the NQDs. To ensure a strong exciton transfer based on NRET from the exciton forming and donating centres to the exciton accepting and light emitting centres in the composite the carboxymethylsulfonyl-propyl group moiety may act as a multi-ligand and interact with NQD surfaces, which may suppress phase separation in solid-state films. This specific chemical integration may make substantially increased NQD loadings possible in the functional PF matrix without suffering from the phase separation. This may increase active excitonic operation.

Figure 5:
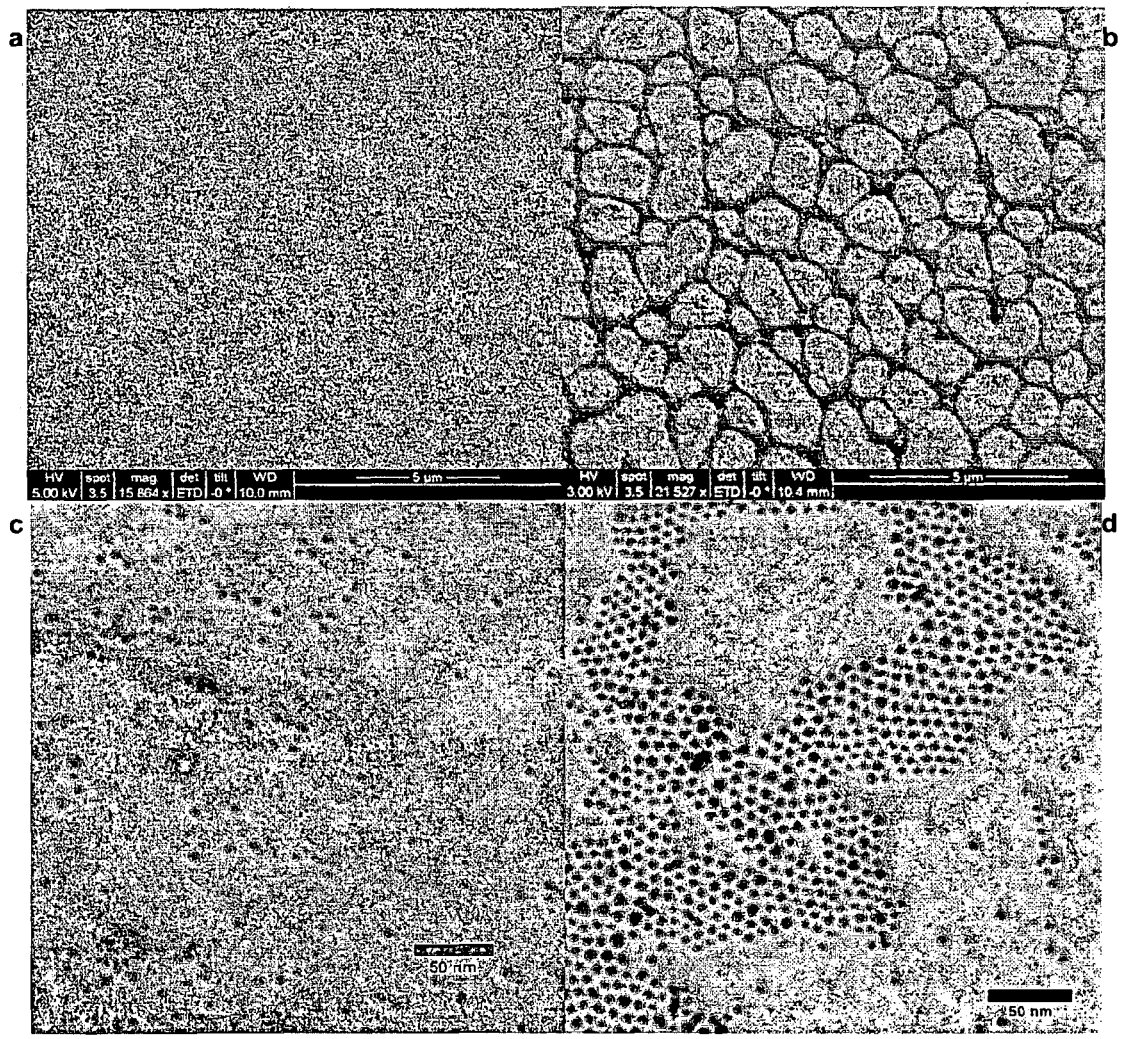
FIGS. 5(a) to 5(d) are electron microscopy images of phase segregation in hybrid and blended NQD thin films. Scanning electron micrographs of (a) functionalised polymer polyfluorene (PF):NQD hybrids and (b) nonfunctionalised PF:NQD blends spin-coated on silicon substrate with the same NQD loading (~45 w %). Severe phase segregation is observed in thin films utilizing nonfunctionalised PF (b), where black regions are mostly polymer and the rest is mostly NQD aggregates as confirmed by EDX, although no significant phase separation can be observed for thin films made with functionalised PF (a). STEM images of NQDs in (c) functionalised PF and (d) nonfunctionalised PF using the same weight amount of NQDs in each case. NQDs are more homogenously dispersed in functionalised PF (c), but NQDs mostly stack together and form aggregates when dispersed in non-functionalised PF (d). NQDs are observed to be lying in a nebulous medium in (c), which is attributed to the surrounding polymers, attaching onto NQD surfaces. This helps to distribute NQDs homogenously.

Film formation properties of the NQDs incorporated separately into either functionalised or nonfunctionalised polymers were studied using scanning electron microscopy (SEM), transmission electron microscopy (TEM) and X-ray photoemission spectroscopy (XPS). For SEM imaging, thin films were prepared via spin coating over precleaned silicon substrates. FIGS. 5a and 5b present the SEM images of the solid-state films of functionalised PF:NQD and nonfunctionalised PF:NQD nanostructures, respectively. Although the same NQD amount (~45 w %) and identical loading conditions were used in both films, we observed severe phase segregation in the case of nonfunctionalised PF:NQDs. On the other hand, due to specific interaction between the functionalised PF and NQDs, homogenous films can be successfully obtained as shown by SEM images, where there is no detectable phase separation (FIG. 5a).

In addition, bright field scanning TEM images (STEM) of the hybrid nanostructures are shown in FIGS. 5c and 5d. Here, the same NQD loading was used again to prepare the TEM samples for both functionalised and nonfunctionalised polymer cases. As seen in FIG. 5c, NQDs are neatly dispersed in the functionalised polymer. On the other hand, NQDs are severely aggregated when mixed with nonfunctionalised PF as clearly evident in FIG. 5d. Here, although polymers cannot directly be imaged due to their amorphous structure, NQDs are observed to reside in a nebulous medium when NQDs are incorporated into functionalised PF matrix. This may be attributed to the surrounding functionalised polymer, attaching onto NQD surfaces and helping NQDs dispersing across the solid film (FIG. 5c). However, for the nonfunctionalised PF case, we did not observe any nebulous formation around the NQDs, which is again considered to indicate that there is no specific interaction between the NQDs and the nonfunctionalised polymer (FIG. 5d).

To understand the specific interaction between the functionalised PF and the NQDs, XPS measurements were further carried out for only NQDs, functionalised PF:NQDs and nonfunctionalised PF:NQDs samples. The peak binding energies of the elemental electronic states of the NQDs are tabulated when alone and in polymer matrices in Table 1. The XPS measurements indicate that the shifts in the peak binding energies are substantially greater in the case of functionalised PF:NQDs as compared to nonfunctionalised PF:NQDs. The maximum shift of ~0.65 eV is observed for Zn in the functionalised PF:NQDs as compared to only NQDs, whereas the same peak shifts only ~0.12 eV for the nonfunctionalised PF-NQDs. This observation suggests that there is a strong interaction between the functionalised PF and the surfaces of the NQDs, since the NQD surfaces are Zn abundant. Furthermore, Zn binding peak shifts towards higher binding energies relative to the only NQD case. This is attributed mainly to the screening effects and high electro-negativity of oxygen atoms of carboxyl acid moieties in the functionalised PF. In comparison, there is no evidence for a strong interaction in the nonfunctionalised PF:NQDs case, since there are only small shifts in the binding peaks, which is possibly due to the change in the chemical microenvironment of the NQDs.

TABLE 1

XPS results for chemical integration of the polymer with the NQDs. Peak binding energies of the elements that constitute a NQD tabulated for the cases of only NQDs, functionalised PF:NQDs and nonfunctionalised PF:NQDs. Shifts in the peak binding energies are also calculated for functional and nonfunctional hybrid nanostructures relative to only NQDs.

| Elements | Only NQDs (eV) | Functionalised PF:NQDs (eV) | Nonfunctionalised PF:NQDs (eV) | Shift in the peak (functionalised PF) (eV) | Shift in the peak (nonfunctionalised PF) (eV) |
| --- | --- | --- | --- | --- | --- |
| Cd | 405.18 | 405.54 | 405.24 | 0.36 | 0.06 |
| Zn | 1022.03 | 1022.68 | 1022.15 | 0.65 | 0.12 |
| Se | 53.93 | 54.58 | 54.29 | 0.65 | 0.36 |
| S | 161.9 | 162.06 | 161.76 | 0.16 | 0.14 |
| O | 532.1 | 532.58 | 532.26 | 0.48 | 0.16 |

Contrary to prior art NQD-polymer systems, in the excitonic pumping scheme according to an example embodiment, exciton diffusion may not be a primary process for the NRET, since exciton diffusion may be suppressed at increased NQD loadings due to two main reasons. The first is that the increased exciton transfer rate leads to the dominance of the exciton decay rate over the exciton diffusion, which is essentially slow. Basically, excitons do not have enough time to diffuse before they are transferred by NRET to a nearby NQD. The second reason is the morphological changes in the polymer caused upon high NQD loading. When a high density of NQDs are integrated into polymer matrix, fast interchain exciton diffusion may become suppressed due to isolation of the polymer chains. On the other hand, slower intrachain exciton diffusion may become the dominant process at increased NQD loaded hybrid films.

Temperature dependent time-resolved fluorescence measurements of the hybrid nanocomposites of NQDs integrated with the functionalised PF were used to investigate the effects of exciton diffusion on NRET.

Figure 6:
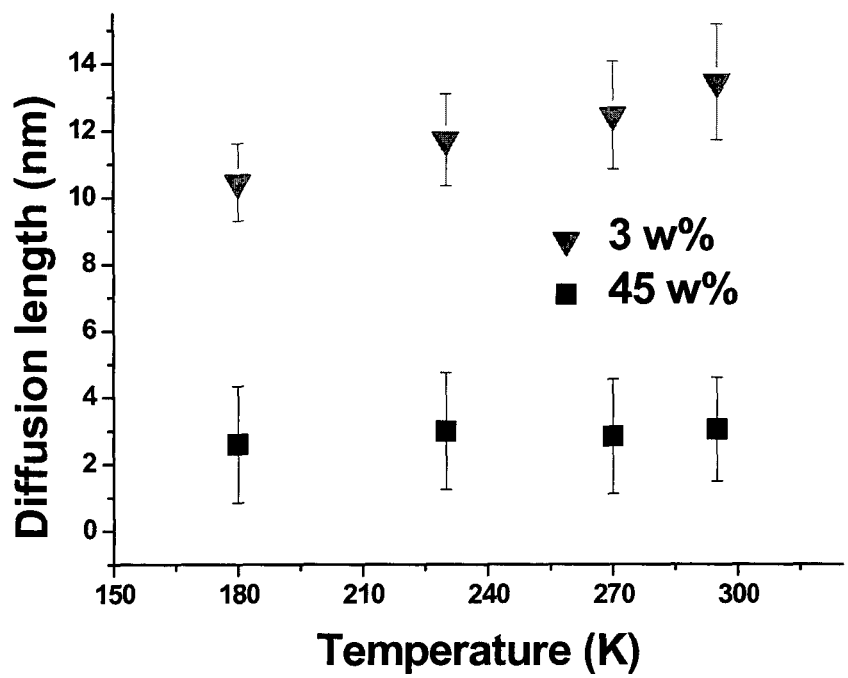
FIG. 6 is a graph of exciton diffusion length in the nanocomposite films of the functionalised PF for two different loading cases of the NQDs: 3 and 45 w %, giving an average distance of 30-35 nm and 10-15 nm from dot to dot, respectively. At the increased NQD loading (45 w %), the exciton diffusion is much lower as compared to lightly loaded case.
Figure 7:
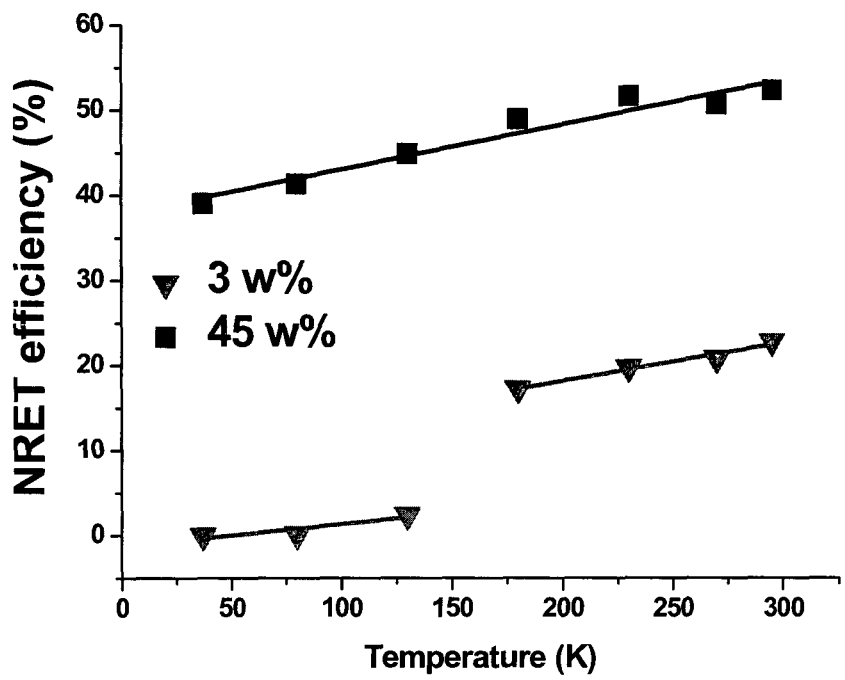
FIG. 7 is a graph of NRET efficiencies are plotted as a function of temperature for 3 and 45 w % NQD loadings. In the case of 45 w % loading, NRET efficiencies are weakly temperature dependent and much higher as compared to the case of 3 w % loading, which exhibits highly temperature dependent NRET efficiencies.

FIG. 6 shows the exciton diffusion length in the functionalised PF measured as a function of temperature from 290 to 180 K for 3 and 45 w % NQD loadings. In the case of 3 w % loading, corresponding to a 30-35 nm inter-particle separation in the thin film, the exciton diffusion length is larger (>10 nm) and, as a result, the exciton diffusion process significantly assists NRET. However, at the increased NQD loading of 45 w %, corresponding to 13-15 nm interparticle separation, the resulting exciton diffusion length is much smaller (<4 nm) compared to the 3 w % case. Consequently, assistance of the exciton diffusion to NRET diminishes. Moreover, temperature dependent measurements reveal that NRET efficiencies are weakly temperature dependent in the case of 45 w % in comparison to 3 w %, since temperature activated exciton diffusion process dominates only in the hybrid system with low NQD loading, as shown in FIG. 7.

Figure 8:
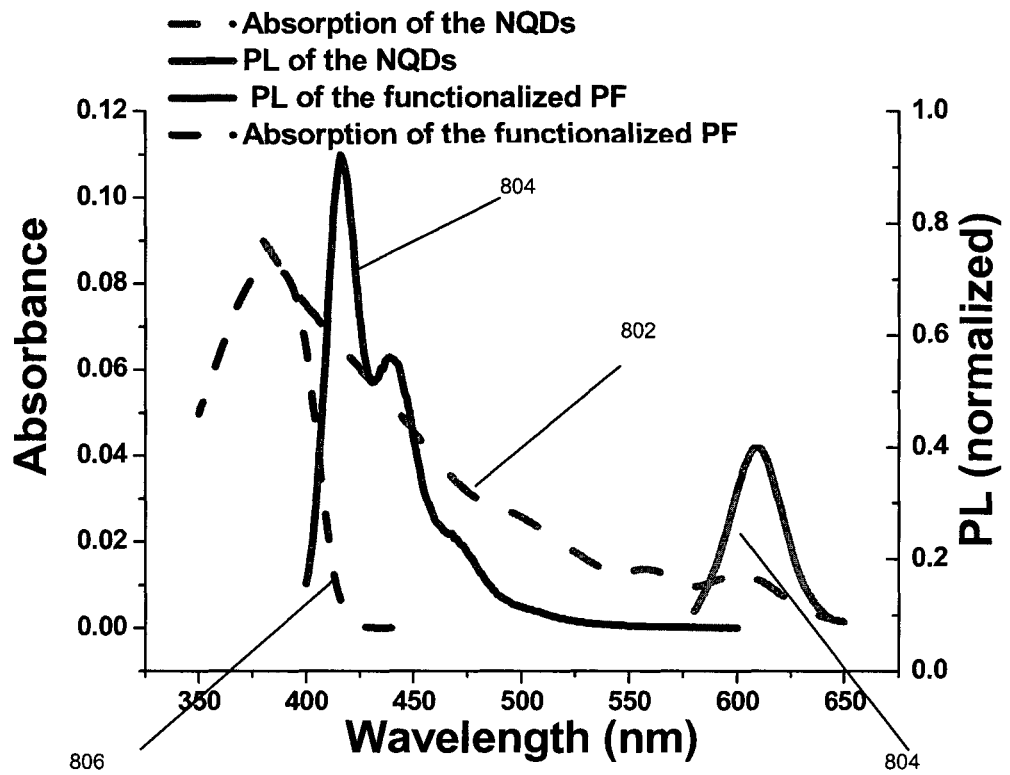
FIG. 8 is a graph of absorbance of NQDs and functionalised PF in solution and thin film. There is a slight broadening in the absorption spectra of the functionalised PF alone in solid-state film. PL of the functionalised PF is also shown in solution and thin film. There is a dramatic change in the PL characteristics as compared to the absorption profile. Mainly increased exciton diffusion in the solid-state film of PF causes red-shifted emission with a stronger tail-emission due to populated emissive defects.
Figure 9:
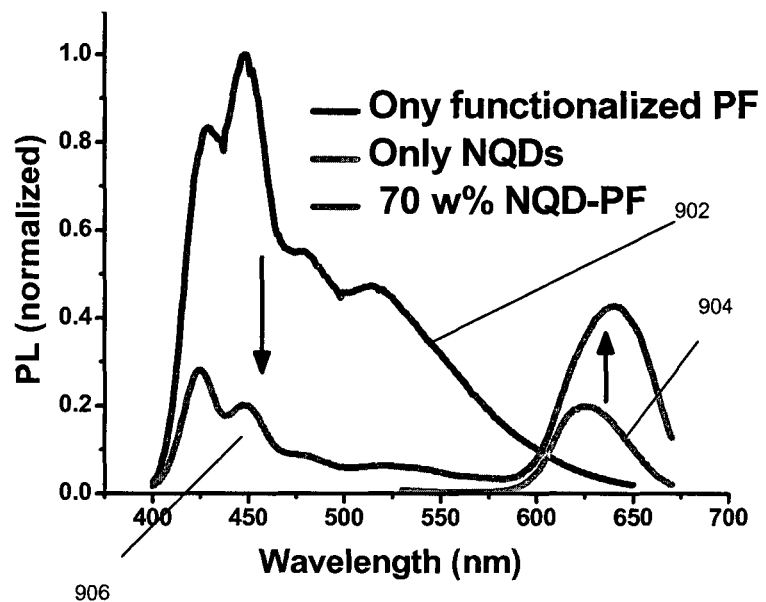
FIG. 9 is a graph of PL spectra of only functionalised PF, only NQDs and 70 w % NQD loaded hybrid are shown. Defect emission is strongly suppressed upon NQD loading and NQD emission is subsequently enhanced.

To realize high NRET rates and efficiencies, a strong spectral overlap between the donor emission and the acceptor absorption may be required. As can be seen from FIG. 8, there is a large overlap between the blue-emitting functionalised PF 806 and the absorption of the red-emitting core/alloyed-shell CdSe/CdS/ZnS NQDs 802 thanks to the broadband absorption spectrum of the NQDs. In FIG. 9, we also observed that the defect state emission of the PF film is suppressed in the case of PF-NQD nanocomposite 906, suggesting that the exciton diffusion is weak and the exciton transfer is strong compared to only functionalised PF 902 or only NQDs 904.

Figure 10:
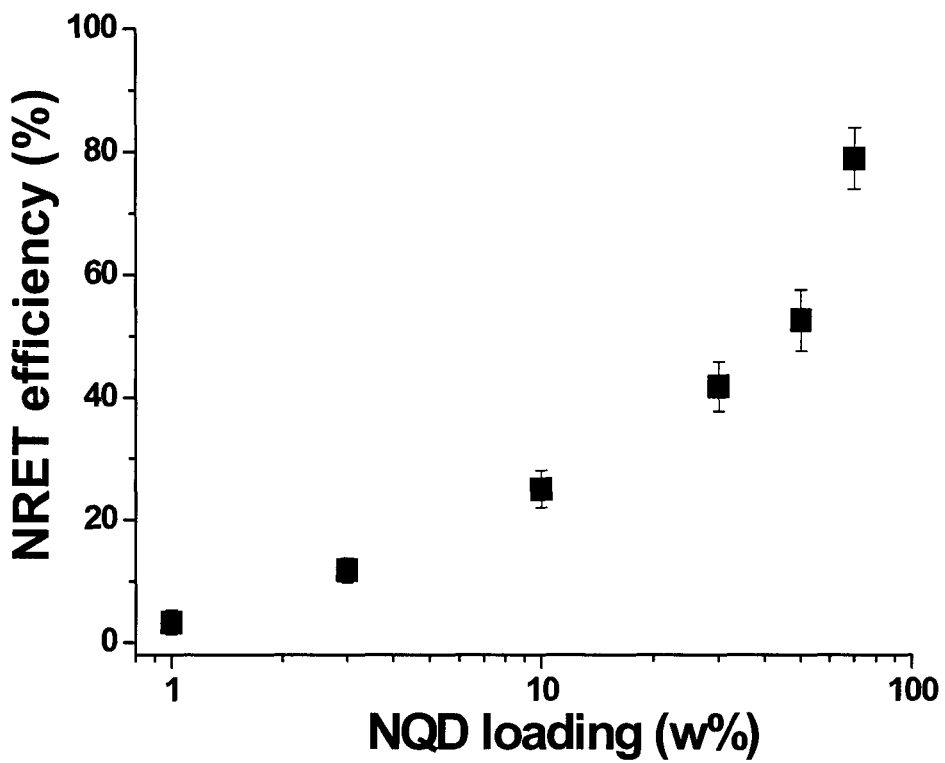
FIG. 10 is a graph of NRET efficiencies at room temperature calculated from steady state PL quenching of the functionalised PF in the nanocomposites having NQD loading from 1 to 70 w % corresponding to NRET efficiencies from 4 to 78%, respectively.

Nanocomposite samples with varying NQD loadings from 1 to 70 w % were prepared and NRET efficiencies were measured by steady state PL measurements at room temperature (FIG. 10). The measured exciton transfer efficiencies are shown to be up to 78% for the NQD loading case of 70 w %.

A NQD-polymer hybrid in solution may have electrostatic attraction, where the excitonic interactions are NRET-dominated as compared to other competing processes such as charge separation and Dexter transfer, due to the shell and ligands of the NQDs despite of the type II like band alignment. This may suggest that, because of the shell thickness of the NQDs (i.e., ZnS in our case) and OA ligands (together thicker than 1.5 nm), the NRET process may be dominant over other competing processes, which may be desirable for excitonic pumping. This dominance is also verified in the functionalised PF-NQD nanocomposites via a simple 1D NRET model, which includes the effects of exciton diffusion in the polymer (FIG. 6). Equation (1) describes the exciton lifetime of the donor functionalised PF, when in the nanocomposite, by including the exciton diffusion process assisting for the NRET.

$$\tau_{DA} = \frac{\tau_D}{1 + \left(\frac{R_{0A}}{\langle r_{av} \rangle - L_D}\right)^6} \quad (1)$$

where $$L_D = \sqrt{D\tau_{DA}} \quad (2)$$

When the model is applied to the temperature dependent exciton lifetimes for the loading cases of 3 and 45 w %, we observed that exciton diffusion assistance to the NRET at high NQD loading level (45 w %) is not significant such that 70% of the excitons are transferred to the NQDs without the help of the exciton diffusion. On the other hand, exciton diffusion is crucial for the low NQD loading level (3 w %) due to the large inter-particle separations.

LAF Model

A requirement of efficient NRET may be the presence of a reasonable average donor-acceptor separation distance, which should be comparable to the Förster radius. Although calculation of the Förster radius from the spectral overlap function may be ambiguous due to lacking extinction coefficient information of the core/shell NQDs, the inventors estimate the Förster radius may be approximately 4-7 nm between similar red emitting CdSe/ZnS NQDs and blue-emitting PF derivative polymers when exciton diffusion is taken into account The fluorescence decays of the polymer and NQDs in hybrid films were analyzed using a time-resolved fluorescence spectrometer of TCSPC system (Fluotime 200) integrated with a close cycle He cryostat. In order to obtain corrected fluorescence decays, we deconvolve the instrument response function (i.e., IRF) from the measured decays.

By assuming homogenous distribution of the NQDs in the hybrid films, the average center-to-center NQD separation is estimated to be around 30 and 14 nm, respectively. After measuring the fluorescence decays of the hybrids separately at the donor and acceptor emission wavelengths at different temperatures, fluorescence decays of the polymer and NQDs are fitted with exponential decays. Donor fluorescence decay in the absence of NQDs was fitted using single exponential decays with near unity $\chi^2$. The presence of the acceptor molecules strongly modifies the donor decay kinetics; therefore, we employed a Loring-Anderson-Fayer (LAF) model to fit the decay curves. The LAF model extends decay kinetics described by Förster for the case of multiple acceptors in a three dimensional medium by considering donor-donor homo-coupling for exciton migration among donor molecules. The LAF model is assumed to work for a wide range of acceptor concentrations and homo-couplings. Donor decay in the presence of acceptors is modeled by $$I_D = I_0 e^{\left[-\frac{t}{\tau_D} - 2\left(\frac{\gamma_{DD}}{\sqrt{2}} + \gamma_{DA}\right)\left(\frac{t}{\tau_D}\right)^{\frac{1}{2}}\right]} \quad (3)$$

$$\alpha = \frac{1}{\tau_D}(R_{0A})^6 \quad (4)$$

$$\beta = \frac{1}{\tau_D}(R_{0D})^6 \quad (5)$$

where α and β are the strength factors for donor-acceptor and donor-donor dipole-dipole interactions, respectively. If the strength of one of the couplings is more dominant, then LAF model can be used within the limit that is dictated by the dominant coupling. We calculated α and β using emission and absorption spectra of the functionalised PF polymer in solution. Förster radius for donor-donor coupling ($R_{OD}$) is found to be 2.3 nm. We use the smallest reported value for the Förster radius between donor-acceptor ($R_{OA}$), which is around 4 nm[13], and find that strength of the donor-acceptor coupling is significantly larger than the strength of donor-donor coupling ($\alpha \gg \beta$). Therefore, $\gamma_{DD}$ can be neglected. LAF model is given by (6)

$$I_D = I_0 e^{\left[-\frac{t}{\tau_D} - 2\gamma_{DA}\left(\frac{t}{\tau_D}\right)^{\frac{1}{2}}\right]} \quad (6)$$

$$\gamma_{DA} = \frac{C_A}{C_{0A}} = C_A \frac{2\pi^{\frac{3}{2}} N R_{0A}^3}{3000} \quad (7)$$

$$\eta = \sqrt{\pi}\, \gamma_{DA} e^{\gamma_{DA}^2}(1 - \text{erf}(\gamma_{DA})) \quad (8)$$

Using (6) and deconvolution fitting data of the measured donor decay curves, $\gamma_{DA}$ (i.e., reduced acceptor concentration) is extracted at different temperatures. Although exciton migration, which depends on temperature, is not explicitly expressed in (7), we observed that $\gamma_{DA}$, which can be interpreted as an effective acceptor concentration, changes with temperature. This temperature dependence of $\gamma_{DA}$ can be attributed to exciton diffusion, which reduces the average effective distance between the donor(polymer chains) and the acceptor (NQDs).

Figure 11:
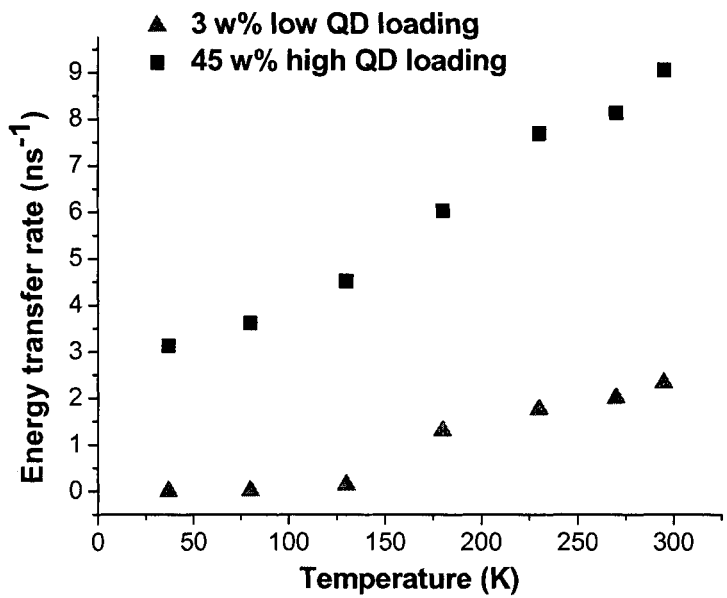
FIG. 11 is a graph of energy transfer rates for 3 and 45 w % loading cases with respect to temperature.

Temperature dependent energy transfer rates are shown in FIG. 11. Energy transfer rates decrease as the temperature drops down. FIG. 11 shows that transfer rates are much higher in 45 w % case as compared to 3 w % case, since the NQD loading is increased and average effective donor-acceptor separation is significantly reduced.

Gösele Model

In order to develop a better physical insight, another model proposed by Gösele et al.[16] is used to include exciton diffusion explicitly in the modeling of donor fluorescence decays. Gösele equation for the donor lifetime modified in the presence of acceptor is given by (9)

$$I_D(t) = I_0 e^{\left[-\frac{t}{\tau_D} - 4\pi D r_F n_A t - 2\gamma_{DA}\left(\frac{t}{\tau_D}\right)^{\frac{1}{2}}\right]} \quad (9)$$

$$r_F = 0.676\left(\frac{R_{OA}}{\tau_D D}\right)^{\frac{1}{4}} \quad (10)$$

where D is the diffusion coefficient (in units of nm²/ns), $n_A$ is the density of acceptors (in units of number of acceptors per nm³), $\tau_D$ is the donor lifetime alone (in units of ns), $\gamma_{DA}$ is the reduced acceptor concentration, which can be expressed in terms of $n_A$, and $R_{OA}$ is the Förster radius between donor and acceptor. The energy transfer efficiency can be written in the integral form of decay curves as given in (11).

$$\eta = 1 - \frac{1}{\tau_D} \int \frac{I_D(t)}{I_D^0} dt \quad (11)$$

For donor decay described by (9), the energy transfer efficiency turns out to be as in (12).

$$\eta = 1 - \frac{1}{1 + 4Dn_A\pi r_F \tau_D} + \quad (12)$$

$$\frac{e^{\left[\frac{\gamma_{DA}^2}{1+4Dn_A\pi r_F \tau_D}\right]} \sqrt{\pi}\, \gamma_{DA}\, \text{erfc}\left(\frac{\gamma_{DA}}{\sqrt{1+4Dn_A\pi r_F \tau_D}}\right)}{(1+4Dn_A\pi r_F \tau_D)^{\frac{3}{2}}}$$

Energy transfer efficiency predicted for our hybrid system by Gösele model (12) depends on $R_{OA}$, $n_A$, $\tau_D$ and D parameters. Donor lifetime in the absence of acceptors ($\tau_D$) is known since they are fitted by using single exponential decays. $R_{OA}$ is generally approximated to be between 4-7 nm and we assume it to be ~6 nm for the further analysis. Two unknowns D and $n_A$ are left to be determined. We do not directly extract D and $n_A$, but instead analyze iso-energy transfer efficiency curves with respect to D and $n_A$.

Model Comparisons

Figure 12:
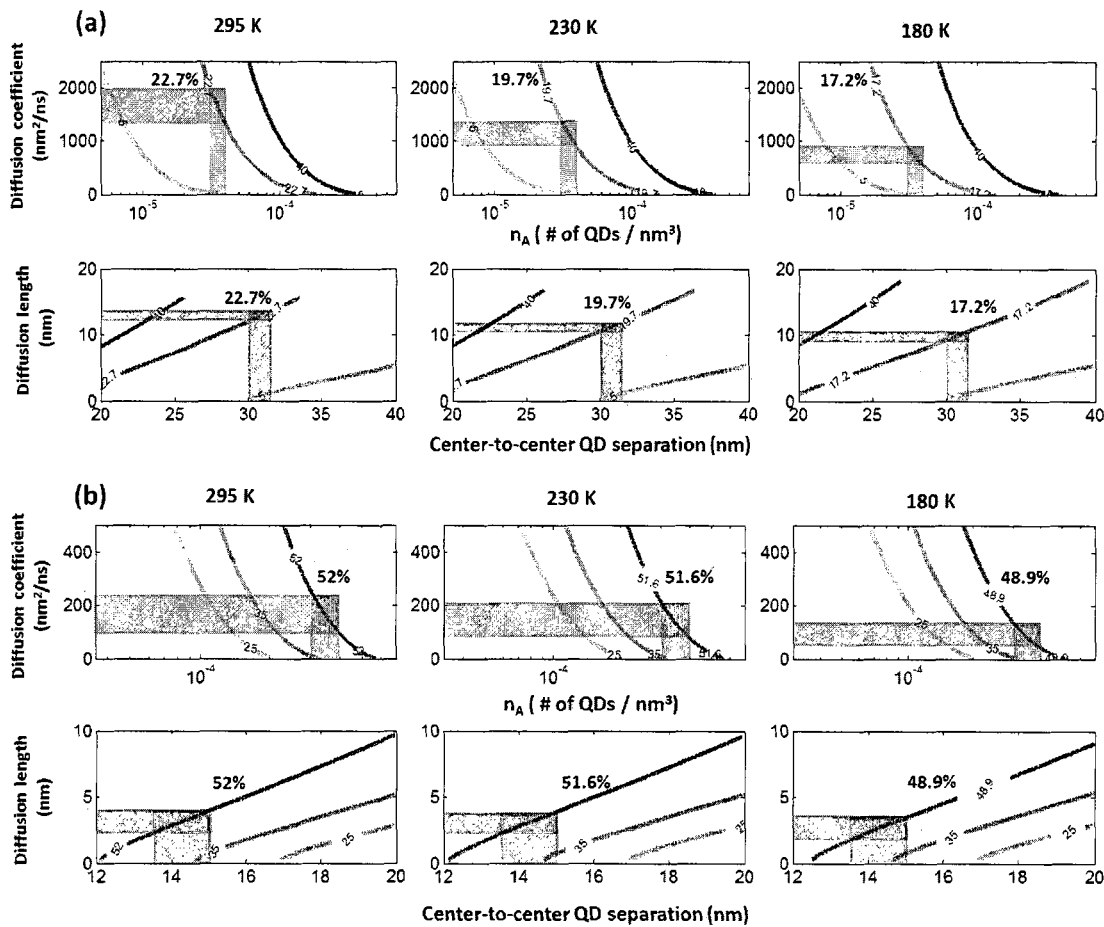
FIG. 12 is a graph of iso-efficiency curves with respect to donor (D) and acceptor (A), shown in the plots of diffusion coefficient D and diffusion length $L_D$ as a function of centre-to-centre NQD separation for (a) 3 w % and (b) 45 w % hybrids at 295, 230 and 180 K obtained via Wisele model. For predicted centre-to-centre NQD separations, a range of diffusion coefficient and length is estimated with shadowed regions. (a) For 3 w %, diffusion coefficient drops rapidly with decreasing temperature, also diffusion length decreases at reduced temperatures due to suppression of the exciton diffusion. (b) Diffusion coefficients are predicted to be lower at higher temperatures in 45 w % as compared to 3 w %, which is attributed to changes in exciton diffusion properties (i.e., inter- and intra-chain diffusion) with changing NQD concentration. Diffusion length is much smaller in 45 w % as compared to 3 w % case and less temperature dependent.

Iso-efficiency curves with respect to the exciton diffusion length ($L_D = \sqrt{D\tau_D}$) and center-to-center NQD separation in hybrid films are shown in FIG. 12. In FIG. 12 iso-efficiency curves for 3 and 45 w % cases at 295, 230 and 180 K, obtained by Gösele model, are presented as a function of D vs. $n_A$ and $L_D$ vs. center-to-center NQD separation. NRET efficiencies extracted from LAF model are represented as iso-efficiency curves. Under the assumption that $n_A$ and center-to-center NQD separation are temperature independent, we determine the possible range of values for D and $L_D$ as a function of temperature as depicted by shaded areas in FIG. 12. For 3 w %, we estimate $n_A$ to be around 3-4×10⁻⁵ corresponding to center-to-center NQD separation of ~30-32 nm. For 45 w %, we estimate $n_A$ to be around 3-4×10⁻⁴ corresponding to center-to-center NQD separation of ~13.5-15 nm.

For 3 w % hybrid, the range values for the diffusion coefficient decreases rapidly as temperature drops down as shown in FIG. 12(a). This decrease in the diffusion coefficient may be because exciton diffusion in PF derivative polymers may have a temperature activation property due to disordered DOS of the polymer. For 45 w % hybrid, we observed different trends for diffusion coefficient as a function of temperature as compared to 3 w % case (FIG. 12(b)). The model predicts D to be more effective in 3 w % than in 45 w %, since the estimated D values are larger for 3 w %. Furthermore, the exciton diffusion length shows different temperature dependent behavior for 3 w % and 45 w % cases. The diffusion length region is observed to be weakly dependent on temperature for 45 w % as compared to 3 w % case. These observations for the exciton diffusion properties reflect the differences in NRET dynamics because of different NQD loadings. For 45 w % case, exciton diffusion length being weakly dependent on temperature is consistent with the temperature independent NRET efficiencies. On the other hand, the decrease in exciton diffusion lengths for 3 w % case explains the observed reduction in NRET efficiencies.

In the case of 45 w %, due to high density of NQDs, the photogenerated excitons do not need to diffuse long before it is transferred to a close NQD. However, in 3 w % case, excitons can diffuse much longer because of the increased donor-acceptor separation distance. At low temperatures, excitons are trapped in the lowest band gap defects of the polymer DOS due to unavailability of the activation energy. Therefore, excitons traverse shorter, which subsequently reduces NRET. Nevertheless, in the case of 45 w %, excitons do not diffuse far due to competing NRET channels.

Figure 13:
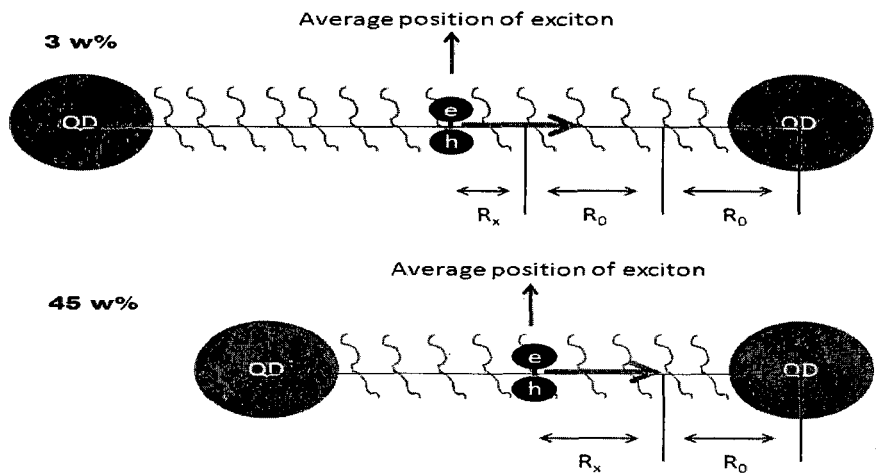
FIG. 13 is a conceptual diagram explaining the lack of NRET transfer in low loading versus high loading.

The exciton diffusion in polymers is expected to occur by two main means: inter- and intra-chain diffusion processes. Inter-chain diffusion may be is faster than intra-chain diffusion in conductive polymer thin films. Inter-chain diffusion generally becomes dominant in highly aggregated thin films of the polymer. On the other hand, intra-chain diffusion becomes dominant when the polymer chains are more isolated as in the case of solutions. To this end, we attribute the lower diffusion coefficients in 45 w % as compared to 3 w % as shown in FIG. 13. At high NQD loadings polymer chains become more isolated in contrast to low NQD loadings such that slower intra-chain diffusion becomes more dominant for 45 w % hybrids.

Figure 14:
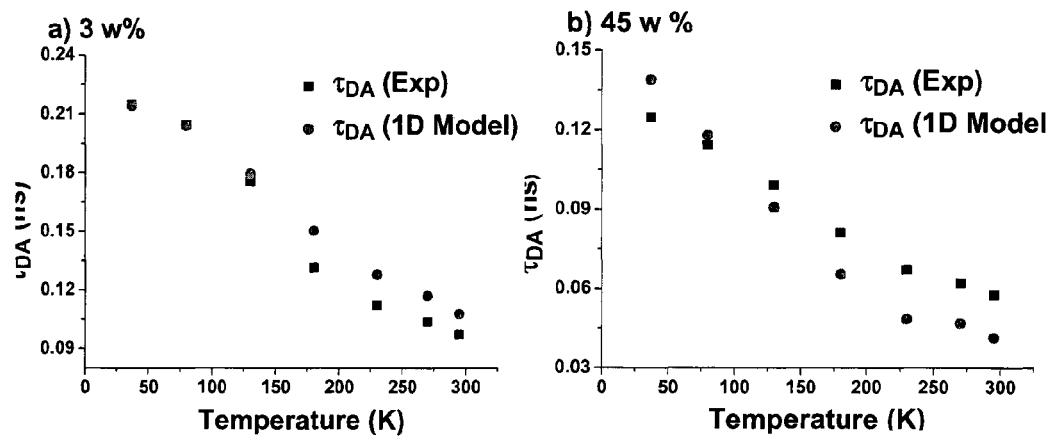
FIG. 14 is a graph of 1D modelling of donor lifetimes in the presence of acceptors for (a) 3 w % and (b) 45 w % NQD loading levels.

Using extracted values for D, center-to-center NQD distance, and $L_D$ from the iso-efficiency curves obtained by Gösele model given in FIG. 12, $\tau_{DA}$ measured in our experiments and computed by (1) as a function of temperature for 3 w % and 45 w % cases is shown in FIG. 14. We project $L_D$ values, in (2) by assuming isotropic exciton diffusion in the polymer. The overall donor lifetimes extracted by our model are in agreement with the experimental results with a maximum deviation of 15 and 30% for the cases of 3 w % and 45 w %, respectively. The 1D model in (1) and (2), corroborates the temperature dependent exciton diffusion dynamics and its effects on NRET.

Figure 15:
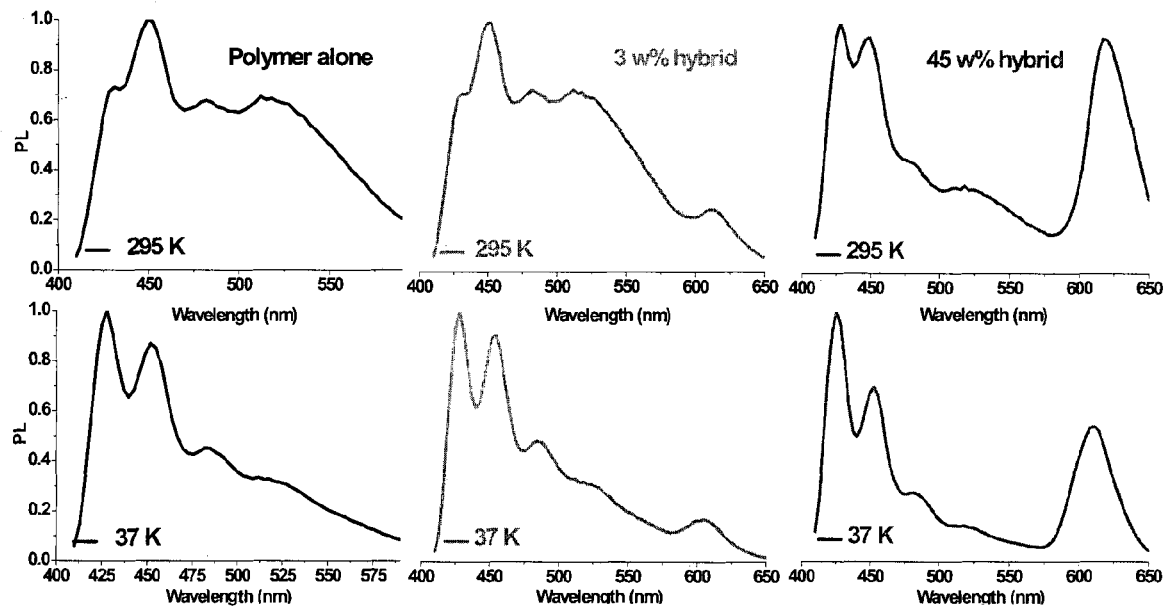
FIG. 15 is a graph of steady state photoluminescence (PL) for only polymer and hybrid films at different temperatures.

In FIG. 15 normalized steady state PL spectra for the polymer alone and the hybrid cases of 3 w % and 45 w % NQD loading at 295 and 37 K are depicted. NQD emission may increase with NQD loading. Emission spectrum of the polymer may be significantly affected by the presence of NQDs. In polymer alone and hybrid 3 w % case at 295 K, the emission is significantly broadened and exhibits a dominant tail emission, but in the hybrid case of 45 w %, the tail emission is substantially suppressed. Another observation is the change of dominant vibronic emission peaks. In the donor alone and 3 w % cases at 295 K, the lower energy vibronic peak becomes dominant, but in 45 w % case the dominant one is the higher energy vibronic peak. These observations in steady state PL for the polymer in the presence and absence of NQDs is directly related to the exciton diffusion properties. The significant difference in the spectrum for 45 w % as compared to polymer alone and 3 w % cases is due to strong suppression of the exciton diffusion.

Figure 16:
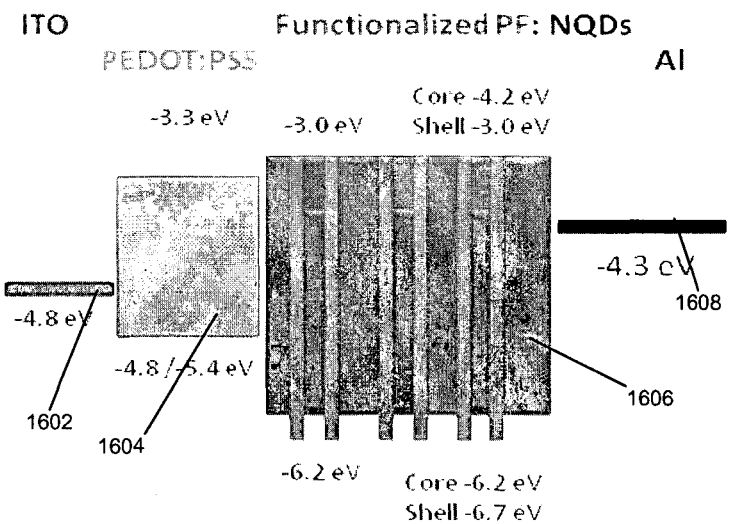
FIG. 16 is a schematic of the energy bands in the structure of the fabricated excitonic LED (XLED).

In an example embodiment excitonically-driven NQD-based hybrid LEDs, dubbed excitonic-LEDs (XLEDs in short) here, were fabricated using a simple device design consisting of ITO 1602/PEDOT:PSS 1604/functionalised PF:NQDs 1606/Al 1608, as sketched in FIG. 16. Hybrid nanocomposite layers utilized high loading NQDs (with 45% or up to 80 w %) to facilitate efficient NRET for strong exciton injection directly from the polymer to the NQDs. We fabricated three sets of proof-of-concept devices varying NQD size tuned for targeted peak emission in green, yellow and red. The size of the NQD determines the degree of quantum confinement. This is defined with respect to the so-called Bohr radius of the material, which can be considered as the radius of the bound electron-hole pair with Coulomb interaction between them as in the quantum model of a hydrogen model (with one electron and one proton). An NQD can be smaller than the Bohr radius of an exciton in the bulk material of NQD (also known as strong confinement regime) or can be bigger than this Bohr radius but still need to be close to the Bohr radius to see quantum confinement effects (called weak confinement regime). Given this, the core of the nanocrystal can be as small as 1 nm up to several tens of nanometer in diameter. Around the core is a shell (or shells) coating, which can a few monolayers to tens of monolayers, therefore sub-nanometer to many nanometers. On top of these, the NQD surface is covered with ligans, which might be sub-nanometer (if a small aromatic) or a few nanometers (if a long chain).

Figure 17:
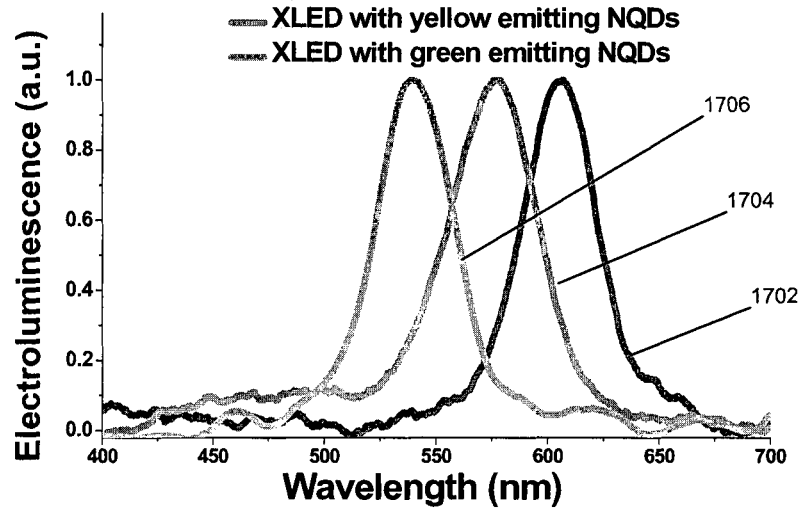
FIG. 17 is a graph of normalized electroluminescence spectrum of XLEDs with green, yellow and red emitting NQDs.

The control samples including 1) only functionalised PF, 2) only NQDs and 3) nonfunctionalised PF:NQDs. The only NQD-LEDs (without any polymer host) exhibit very weak and unstable electroluminescence (EL) due to poor electrical injection. On the other hand, only functionalised PF-LEDs (with no NQDs) emit blue light together with a strong green defect emission in its EL. In addition, because of these defects, only functionalised PF devices are quite inefficient as compared to the hybrid XLEDs. However, the fabricated XLEDs lead to more stable EL compared to only PF devices possibly due to the suppression of the exciton diffusion and subsequent defect population. Furthermore, these proof-of-concept demonstrations of XLEDs using functionalised PF:NQDs exhibit EL spectra where the emission comes only from the NQDs as shown in FIG. 17 for red 1702, yellow 1704 and green 1706.

Figure 18:
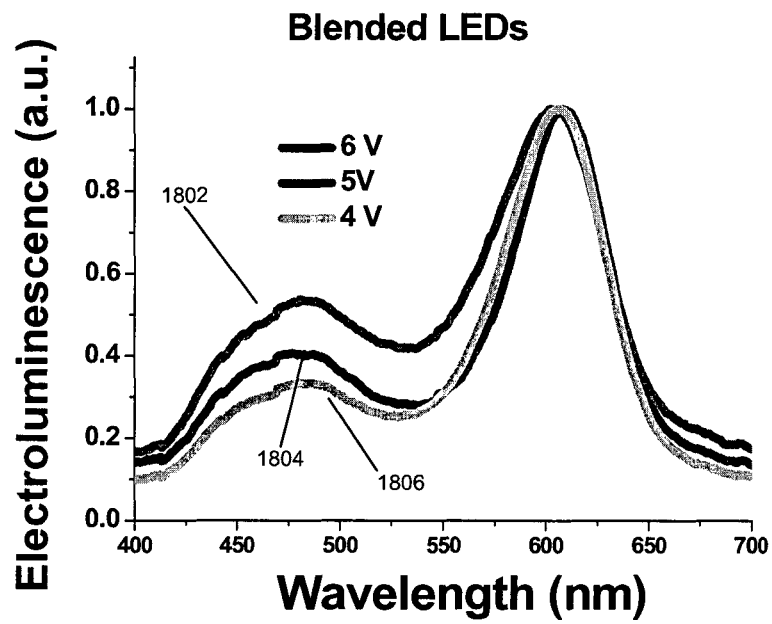
FIG. 18 is a graph of LEDs of blended nonfunctionalised PF:NQDs at different bias voltages showing varying emission spectra due to shift in the exciton recombination zone in the phase segregated films.
Figure 19:
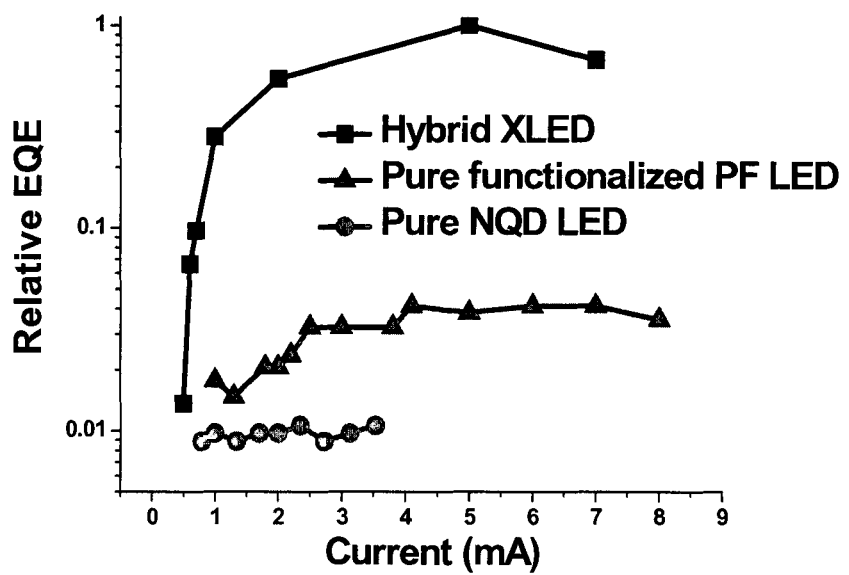
FIG. 19 is a graph of the relative EQE of the XLED with green emitting NQDs, only functionalised PF-LED and only NQD-LED.

In all of these XLEDs polymer emission in the EL spectrum may be suppressed because of the efficient excitonic transfer. In contrast, reference LEDs made of blends of non-functionalised PF:NQDs may exhibit mixed emission from both NQDs and PF (FIG. 18), indicating that the excitonic transfer is incomplete due to the phase segregation (FIG. 5), unlike the XLEDs of functionalised PF:NQDs. Moreover, the emission spectrum of nonfunctionalised PF:NQDs LEDs is again unstable with respect to the driving voltage due to the shifts in the exciton formation zone and correspondingly changing phase segregated regions as shown by spectrum when driving with 6V 1802 5V 1804 and 4V 1806. In terms of external quantum efficiencies (EQE), devices of only functionalised PF have quite poor EQEs due to the low lying HOMO level of the polymer, which was measured to be −6.2 eV using cyclic voltammetry. On the other hand, the excitonic operation in the XLEDs enabled a substantial enhancement in the resulting EQEs, despite the low HOMO level of functionalised PF. In FIG. 19 relative EQEs of the XLEDs, only PF and only NQD LEDs are shown. The XLEDs exhibit more than an order of magnitude higher EQEs compared to blue emitting only functionalised PF LEDs, which have typical EQEs ranging from 0.05% to 1.2%. Only NQD LEDs exhibit the poorest performance due to the poor charge injection and transport into the NQD thin film. This enhancement in the EQEs is mainly due to the fact that excitation energy in the polymer was much more effectively utilized through NQD emission, although proper hole transport layer for the functionalised PF is not employed (see FIG. 11).

Poor hole transport injection for polyfluorene-based materials may be improved by the inclusion of optimized hole transport layers. These hole transport layers may be a thin film spin-casted before the polymer-NQD composite film and after the hole injection layers, for example on top of the PEDOT:PSS layer.

Excitonic pumping can used in different architectures and is not limited to polymer-NQD nanocomposites. The mechanism of injecting excitons in the emission centres, as opposed to the charge injection as used in conventional LEDs of polymer, LEDs of NQDs, or LEDs of NQD-polymer blends, may be used in other devices. The exciton formation is separated from the light generation. Electrons and holes are injected to the exciton formation centres from the emission centres, where the transferred excitons radiatively recombine and give light.

Example 1

The synthesis procedure for NQDs described in Lim et al.[17] is incorporated herein by reference.

Film Preparation

Double side polished quartz substrates were cleaned using multiple solvents (detergent, water, acetone and isopropanol). 20 mg/mL of functionalised PF in THF and 10 mg/mL of CdSe/CdS/ZnS NQD solution in toluene were mixed and stirred with sonication. Subsequently, the mixture was spin-coated at 2000 rpm for 1.5 min. The resulting thin film thickness was measured to be 60 nm using a profilometer.

EM and TEM Characterizations

Scanning electron microscopy (Quanta 200 FEG, FEI) of the hybrid and blend films spin-coated on (100) p-doped silicon substrates was carried out. Energy dispersive X-ray spectrometer integrated with our SEM system (EDAX, Materials Analysis Division) was used to understand the phase segregated parts of the films. Transmission electron microscopy (Technai G2 F30, FEI) was used with ultra thin carbon grids in scanning mode via high sensitivity HAADF STEM detector.

Time-Resolved and Steady State PL

Steady state PL spectrum was obtained using time resolved fluorescence spectroscopy (FluoTime 200, PicoHarp 300) via integrating the decay curves measured with time-resolved emission spectra mode (TRES) at cryogenic. To account for our wavelength dependent detection response of the detector, a fully calibrated PL spectrometer (Fluorolog 3, Horiba JobinYvon) was utilized. Here an integrating sphere and its thin film compartment of the Fluorolog 3 were used. PL spectrometer (Cary Eclipse, Varian) and UV-visible spectrometer (Cary 100, Varian) were also employed for measurements of solution samples.

Device Fabrication and Characterization

The device fabrication starts with substrate preparation. We used square glass-ITO substrates with 15 Ω/sq sheet resistance (Kintec) of 1.5 cm×1.5 cm in size. First, we etched ITO using $HCl:HNO_3:H_2O$ (4.6:0.4:5) etchant solution from the side. Then, we cleaned the substrate by sonicating them in deionized water-detergent (Hellmanex III, HellmaAnalytics) mixture, deionized water, acetone, and isopropanol for 15 min. After this cleaning, substrates were UV-Ozone cleaned right before spin-coating PEDOT:PSS (using 500, 4000 and 5000 rpms for 5, 120 and 120 s, respectively). The film thicknesses may need to be adjusted for different films and their viscosities. Then, the film was annealed in a glove box at 140° C. for 2 hours. A mixture of hybrid solution was prepared using 20 mg/mL of functionalised PF and 10 mg/mL of CdSe/CdS/ZnS NQDs and mixed using a vortex for a few hours. The hybrid solution was spin-coated on PEDOT:PSS coated substrates via spin coating at 2000 rpm for 2 min, although different times may be used for a different thickness layer. The active layer was annealed at 70° C. in nitrogen environment. In a thermal evaporator, 100 nm thick Al film was deposited. Later, devices were encapsulated with a cover glass using two mixture epoxy (Bison). Commercial deposition methods of casting soft material into a solid film can also be used depending on the application. For example, imprinting, inject printing, self-assembly, etc.

The control group, was (poly[(9,9-dioctylfluorenyl-2,7-diyl)-co-(N,N'-diphenyl)-N,N'di(p-butyl-oxy-phenyl)-1,4-diaminobenzene)]), dubbed nonfunctionalised PF here (since it does not contain any specific groups with high binding affinity). Nonfunctionalised PF was obtained from American Dye Source (ADS 232 GE).

While example embodiments of the invention have been described in detail, many variations are possible within the scope of the invention as claimed as will be clear to a skilled reader.

REFERENCES

[1] Achermann, M. et al., Energy-transfer pumping of semiconductor nanocrystals using an epitaxial quantum well. Nature 429, 642-646 (2004).

[2] Achermann, M., Petruska, M. A., Koleske, D. D., Crawford, M. H., Klimov, V. I., Nanocrystal-based light emitting diodes utilizing high-efficiency nonradiative energy transfer for color conversion. Nano Lett. 6, 1396-1400 (2006).

[3] Nizamoglu, S., Guzelturk, B., Jeon, D.-W., Lee, I.-H., Demir, H. V., Efficient nonradiative energy transfer from InGaN/GaN nanopillars to CdSe/ZnS core/shell nanocrystals. App. Phys. Lett. 98, 163108 (2011).

[4] Sun, Q. et al. Bright, multicoloured light-emitting diodes based on quantum dots. Nature Photonics 1, 717-722 (2007).

[5] Kim, T.-H. et al., Full-colour quantum dot displays fabricated by transfer printing. Nature Photonics 5, 176-182 (2011).

[6] Colvin, V. L., Schlamp, M. C., Alivisatos, A. P., Light-emitting diodes made from cadmium selenide nanocrystals and a semiconducting polymer. Nature 1994, 370, 354-357.

[7] Coe-Sullivan, S., Woo, W., Bawendi, M. G., Bulovic, V., Electroluminescence of single monolayers of nanocrystals in molecular organic devices. Nature 420, 800-803 (2002).

[8] Caruge, J. M., Halpert, J. E., Wood, V., Bulovic, V., Bawendi, M. G., Colloidal quantum-dot light emitting diodes with metal-oxide charge transport layer. Nature Photonics 2, 247-250 (2008).

[9] Achermann, M. et al., Energy-transfer pumping of semiconductor nanocrystals using an epitaxial quantum well. Nature 429, 642-646 (2004).

[10] Talapin, D. V., Lee, J.-S., Kovalenko, M. V. and Shevchenko, E. V., Prospects of colloidal nanocrystals for electronic and optoelectronic applications. Chem. Rev. 110, 389-458 (2010).

[11] Anikeeva, P. O., Madigan, C. F., Halpert, J. E., Bawendi, M. G., Bulovic, V., Electronic and excitonic processes in light-emitting devices based on organic materials and colloidal quantum dots. Phys. Rev. B. 78, 085434 (2008).

[12] Chen, L., Li, P., Tong, H., Xie, Z., Wang, L., Jing, X., Wang, F., White electroluminescent single-polymer achieved by incorporating three polyfluorene blue arms into a star-shaped orange core, J. Polym. Sci. A Polym. Chem. 50, 2854-2862 (2012).

[13] Chien, C.-H, Liao, S.-F., Wu, C.-H., Shu, C.-F., Chang, S.-Y., Chi, Y., Chou, P.-T., Lai, C.-H., Electrophosphorescent polyfluorenes containing osmium complexes in the conjugated backbone, Adv. Funct. Mater. 18, 1430-1439 (2008).

[14] Beljonne, D., et al., Interchain vs. intrachain energy transfer in acceptor-capped conjugated polymers. PNAS, 99, 10982-10987 (2002).

[15] Stöferle, T., Scherf, U., Mahrt, R. F., Energy transfer in hybrid organic/inorganic nanocomposites. Nano Lett. 9, 453-456 (2009).

[16] U. Gösele, M. Hauser, U. K. A. Klein, and R. Fray, Diffusion and long-range energy transfer, Chem. Phys. Lett. 1975, 34, 519-522.

[17] Lim, J., et al., Perspective on synthesis, device structures, and printing processes for quantum dot displays. Optics Materials 2, 594-628 (2012).

The invention claimed is:

1. A light emitting device comprising:
   a hole injection layer,
   an electron injection layer,
   a composite emitter layer including a soft matter or soft material exciton donor matrix and exciton acceptor nanoparticles substantially dispersed within the exciton donor matrix,
   wherein the exciton donor matrix is a functionalised polymer, and wherein the nanoparticles have a loading of above 4% and are bound with the functionalised polymer so that electrons from the electron injection layer and holes from the hole injection layer generate excitons in the exciton donor matrix, and the primary mechanism of photon generation at the nanoparticles is substantially non-radiative energy transfer of the generated excitons directly into the nanoparticles.

2. The device in claim 1 wherein the substantial loading is above 45%, above 70% or above 80%.

3. The device in claim 1, wherein the functionalised polymer is a polyfluorene derivative co-polymer functionalised with one or more carboxymethylsulfonyl groups.

4. The device in claim 1, wherein the nanoparticles are a quantum dot core with an alloy shell and/or ligand surface functionalisation.

5. The device in claim 4 wherein the quantum dot core and shell(s) are CdSe/CdZnSeS/ZnS or CdSe/CdS/ZnS.

6. The device in claim 4 wherein the ligand surface functionalisation is oleic acid (OA).

7. The device in claim 4, wherein shell and/or ligand surface functionalisation thickness is greater than 1.5 nm.

8. The device in claim 1, wherein the average nanoparticles separation distance is comparable to the Forster distance.

9. The device in claim 1, wherein a spectral overlap integral between the emission of the exciton donor matrix and the absorption of the nanoparticles is substantial.

10. A method of fabricating a light-emitting device comprising
    depositing a hole injecting layer on a substrate anode,
    depositing a soft matter or soft material exciton donor, exciton acceptor nanoparticle emitter layer on the hole injecting layer, and
    depositing a cathode on the emitter layer;
    wherein the emitter layer comprises a functionalised polymer, and wherein the nanoparticles have a loading of above 4% and are bound with the functionalised polymer so that electrons from the cathode and holes from the hole injecting layer generate excitons in the exciton donor of the emitter layer, and the primary mechanism of photon generation at the nanoparticles is substantially non-radiative energy transfer of the generated excitons directly into the nanoparticles.

11. The method in claim 10 further comprising annealing the hole injecting layer and/or the emitter layer prior to deposition of the subsequent layer.

12. The method in claim 10 further comprising depositing a hole transport layer between the hole injecting layer and the emitter layer prior.

13. The method in claim 10 further comprising mixing a functionalised polymer and nanocrystal quantum dots with a solvent until any agglomerations are substantially minimised, and the depositing the emitter layer comprising spin coating the mixed solution on the hole injecting layer.

14. The method in claim 10 further comprising encapsulating the respective layers.

15. A light-emitting diode comprising:
    a polymer host comprising a functionalized polymer, and
    a loading of Nanocrystal Quantum Dot NQD emitters above 4% chemically integrated into the host via the functionalized polymer,
    wherein an electrical pumping scheme primarily relies on non-radiative exciton injection into the NQDs from the polymer host instead of a direct charge injection scheme.

* * * * *